United States Patent [19]
Roth

[11] 4,032,885
[45] June 28, 1977

[54] DIGITAL CORRELATOR

[75] Inventor: Albert Roth, San Diego, Calif.

[73] Assignee: The United States of America as represented by the Secretary of the Navy, Washington, D.C.

[22] Filed: Mar. 1, 1976

[21] Appl. No.: 662,794

[52] U.S. Cl. .................... 340/146.1 AX; 178/69.1; 340/146.2; 340/146.3 WD
[51] Int. Cl.² .......................................... H03K 5/18
[58] Field of Search .................... 178/69.5 R, 69.1; 235/181; 340/146.1 AL, 146.1 AX, 146.1 D, 146.1 E, 146.2, 146.3 WD

[56] References Cited
OTHER PUBLICATIONS

Galpin; R. J., *Digital Synchronizer* in IBM Tech. Disc. Bull. 15(1): pp. 81–83, June 1972.

*Primary Examiner*—R. Stephen Dildine, Jr.
*Attorney, Agent, or Firm*—R. S. Sciascia; G. J. Rubens; T. M. Phillips

[57] ABSTRACT

A digital correlator which will detect a digital pattern in the presence of noise. In an *n* bit pseudo-noise (PN) sequence, comparison is made of the input word with *m* desired PN coded word patterns; a flag is raised when a pattern is detected and identified. In one embodiment all possible (six) PN code words are programmed in a ROM (Read Only Memory). The input word is compared with all six code words in a parallel sequential search mode. In another embodiment, comparison is made of a 31 bit input word with a programmed PN code word in a single parallel comparison.

9 Claims, 5 Drawing Figures

DIGITAL CORRELATOR

BACKGROUND OF THE INVENTION

In the transmission of digitally encoded data, it is usually required to identify the beginning or end of an event, or to synchronize the receiving equipment with the transmitter. For example, in the transmission of picture data (e.g., facsimile,) it is necessary to identify the start of message, end of message, beginning of line and in other applications, one or more synchronizing signals are periodically injected during line scans to minimize loss of data. These signals must have characteristics such that they will be easily recognized by the receiver, but not mistaken for intelligence data.

One such family of coded words is classed as PN (pseudo-noise) codes whose bit length is $2^n-1$, where $n$ is an integer. The choice of $n$ is dependent on the "noisiness" of the transmission channel, i.e., the probability that noise will cause errors in the received data. The larger the value of $n$, the greater will be the probability of being able to differentiate between data and the PN code. In many applications, $n$ is chosen as 5, i.e., the number of binary bits in the PN code is 31. For any n there are a maximum number of unique PN codes that can be generated. For the case of $n = 5$, there are six possible codes, any or all of which may be used for a given application. The number of possible codes increases with increasing $n$.

A further requirement for optimum performance is that the PN word be recognized as such even if it is degraded by noise, i.e., one or more bits may be in error.

SUMMARY OF THE INVENTION

In accordance with one example of the invention, there is provided an error-tolerant bit pattern detector (digital correlator) which compares the pattern (a group of one and zeros) of 16 bits of data with the pattern to be detected (herein referred to as the reference or PN word.) The comparison is made in a digital comparator which outputs a 0 if the bits being compared are alike, and a 1 if different. The 16 bit output of the comparator (which thus contains a 1 for each mismatch, or error) is fed to a "conversion" ROM which generates a coded binary number equal to the number of errors. The output of the conversion ROM is connected to a "tolerance" ROM, each output of which goes high for each increasing number of error bits. For example all lines will be low if no errors occur, line 1 goes high if one error occurs, lines 1 and 2 will go high it two errors occur, lines, 1, 2, and 3 will go high if three errors occur, etc. If eight or more errors occur, the last line will go high. Thus, if the number of allowable errors is $m$ or less, the corresponding output of the tolerance ROM is monitored, and that line will go high if the input conditions are met.

In accordance with another example of the invention, there is provided an error tolerant bit pattern detector (digital correlator) that searches through six 31 bit PN words stored in a pre-programmed ROM and sequentially compares each word with the data input. The search and comparison technique is made by selecting the first eight bits of the data input and comparing it with the first eight bits of say the first PN word, in a network of eight exclusive OR gates (digital comparator.) The digital comparator makes a bit-by-bit comparison between the two input work segments and generates a 0 for each position when the two bits are alike, and a 1 bit if the corresponding two bits are not alike. The eight outputs from the exclusive OR gates are fed to a conversion ROM, which converts the number of ones to an equivalent binary number. This number is fed to a four bit adder, which adds the output of the conversion ROM with the contents of an accumulator (initially set to zero), and the sum then stored back into the accumulator.

The second eight bit segment of the input data word is then selected and compared with the equivalent segment of the first PN word, and the number of detected errors are added to the previous value in the accumulator. This segment-by-segment comparison is continued until all bits of the data word are compared with all bits of the first PN word. At this time the number of errors stored in the accumulator are compared with a tolerance number programmed into a digital magnitude comparator whose output will go high if the number of errors is equal to or less than the tolerable value.

The accumulator is then cleared, and the same input data word is compared with the second PN word stored in the ROM. This process continues until the input word has been compared with all six stored PN words. This embodiment requires an internal clock rate which is 24 times as great as the input data rate since 24 separate comparisons (four for each of six PN words) must be made for each data word.

It is therefore an object of the present invention to provide an improved error tolerant bit pattern detector which is simple and economical.

Other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Figure 1:
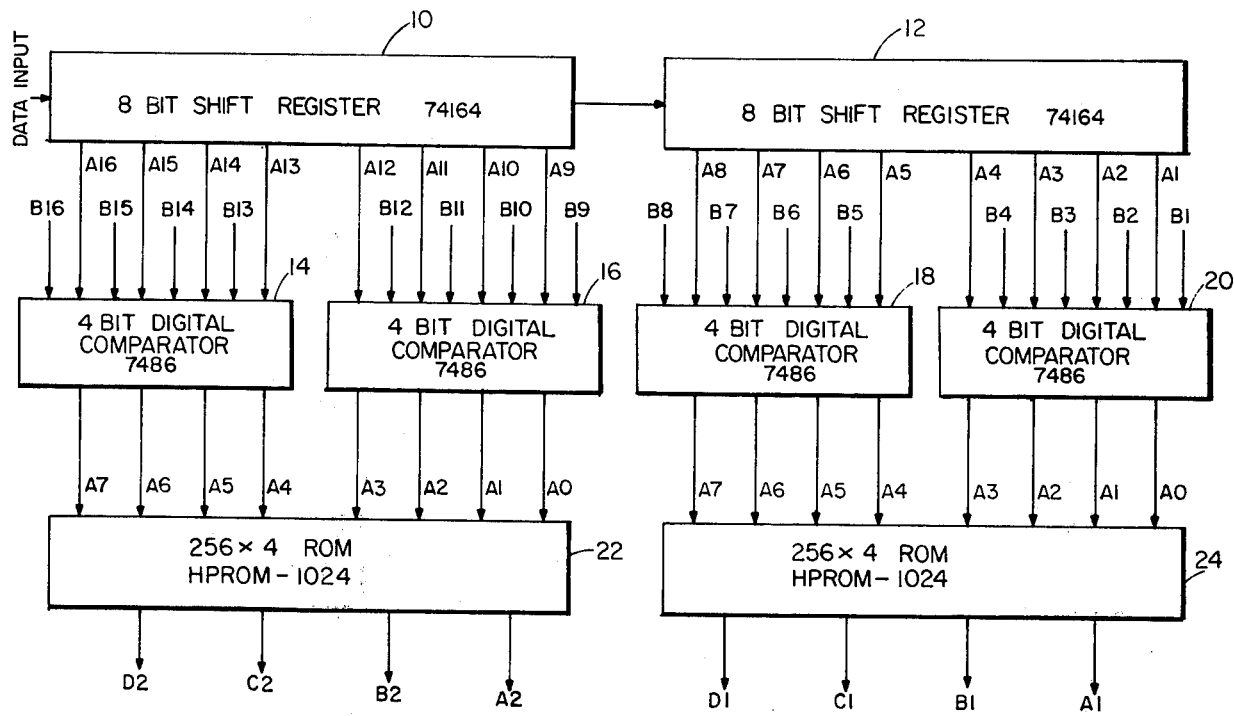
FIGS. 1 through 3 show in block diagram for a 16 bit pattern detector.

Referring now to FIG. 1 wherein there is shown data inputted to 8 bit shift registers 10 and 12. The outputs (A1-16) from shift registers 10 and 12 are fed to one set of 16 inputs to four 4 bit digital comparators 14, 16, 18, and 20. The 16 (or 15) bit pattern to be detected is inputted to a second set of inputs to the digital comparator. The sixteen output lines from the four comparators are broken into two groups of eight lines each of which are connected respectively to two 256 by 4 Read Only Memories 22 and 24. Read Only Memories 22 and 24 are so programmed that if all address lines are low (indicating no errors) all four outut lines A, B, C, and D will also be low (i.e. A=B=C=D=0). If any of the address lines are high, as for example, 00000001, 00000010, 100000000, 00100000, (indicating one error in that group) then the outputs will be A=1, B=C=D=0, where A is the least significant bit and D is the most significant bit. There then is provided from the output of each ROM a binary coded representation of the number of ones (errors) on the input address line according to the following truth table:

| INPUT ADDRESS | ROM OUTPUT D C B A |
|---|---|
| 0 Errors | 0 0 0 0 |
| 1 Error | 0 0 0 1 |
| 2 Errors | 0 0 1 0 |
| 3 Errors | 0 0 1 1 |
| 4 Errors | 0 1 0 0 |
| 5 Errors | 0 1 0 1 |
| 6 Errors | 0 1 1 0 |
| 7 Errors | 0 1 1 1 |
| 8 or more Errors | 1 0 0 0 |

Figure 2:
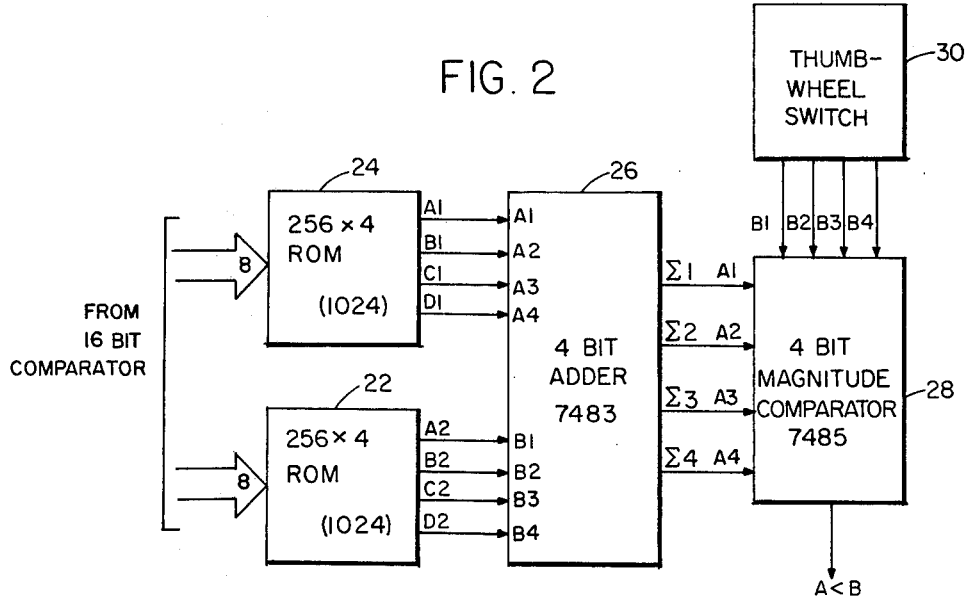

The manner in which the output data from ROMs 22 and 24 are utilized is dependent upon how flexible a system is desired; several choices are available. If the number of tolerable errors is known and fixed, a Boolean expression may be derived by constructing a truth table from the ROM's inputs and outputs, and a logic circuit obtained through the use of a Karnaugh map. The output of the logic circuit will go to the desired state if the number of errors on both groups of lines exceeds the allowable value. A single 7462 and/or integrated circuit DIP can be used for this function. If the number of allowable error bits is a pre-selected variable within the range of 0 through 7, the outputs from ROMs 22 and 24 may be connected to a four bit adder 26 as shown in FIG. 2. The output of adder 26 is a binary coded representation of the sum of the two groups of data words from ROMs 22 and 24, which in turn represents the total number of error bits in the 16 bit word. By way of example, if there are three error bits, the sum 4 ($\Sigma 4$), sum 3 ($\Sigma 3$), sum 2 ($\Sigma 2$), sum 1 ($\Sigma 1$) lines out of adder 26 will be 0011, respectively. Five error bits will produce code 0101 out of adder 26, etc.

The output of adder 26 is connected to the A inputs of a four bit magnitude comparator 28. The B inputs to comparator 28 are connected to a digital thumb wheel switch 30 into which the number representing the number of allowable errors is entered. For example, if three or less errors are acceptable the thumb wheel switch 30 would be set to 4, and the "A less than B" output of the comparator is monitored. Then any word containing three or less errors will cause the "A less than B" line to go high, indicating a valid bit pattern has been received. Thumb wheel switch 30 would then always be set to a value which is one number greater than this desired tolerable error.

Figure 3:
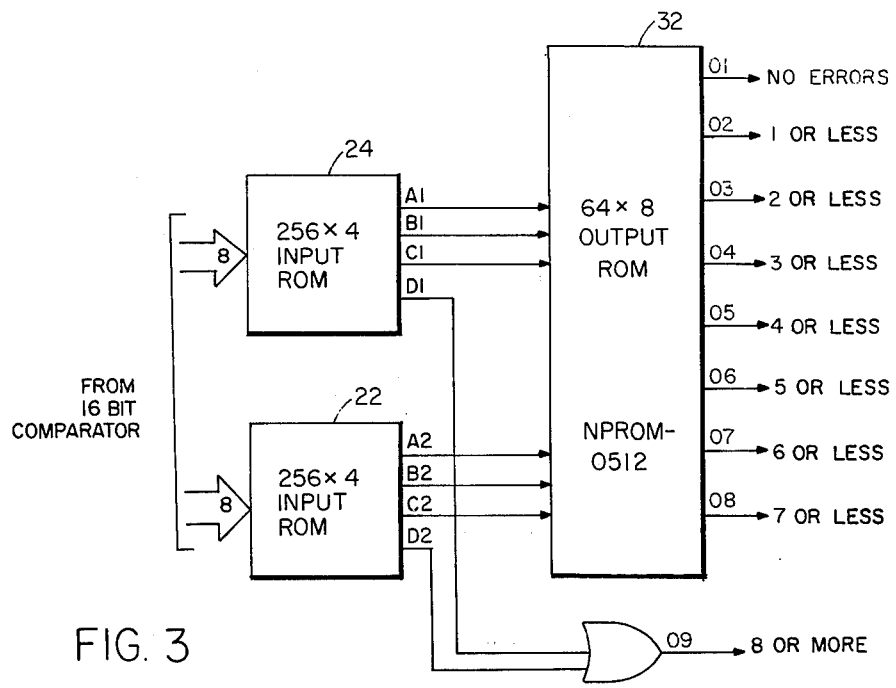

In the embodiment of FIG. 3 a 64 by 8 ROM 32 is used in place of the adder 26 and comparator 28 of FIG. 2. As shown in FIG. 3 only the A, B, and C inputs from both ROMs 22 and 24 are connected to the six address lines of the output ROM 32. ROM 32 should be so programmed that if all input lines are low (no errors) all output lines will be low. If an error occurs on address line A1 or A2 and no others, one output line 01 goes high. If two errors occur as indicated by address lines B1 or B2, or both A1 and A2 being high, then output lines 01 and 02 will go high. Similarly, if three errors occur, then lines 01, 02, and 03 will go high; the others will remain low. This pattern occurs for successive numbers of errors except for the last line, which is the output of the OR gate. This output goes high if eight or more errors occur. The reason for this output is that if eight errors are inputted to either ROM 22 or 24, then D1 or D2 will go high, while the others will be low. Thus all outputs from ROM 32 will be low, whereas the output of the OR gate will be high. Thus, for example, if no errors can be tolerated, line 01 would be monitored since this line will be low only for the condition where there are no errors. If four or less errors can be tolerated, then output line 05 would be monitored, since this line will remain low for up to 4 errors, but will go high for five or more errors.

Figure 4:
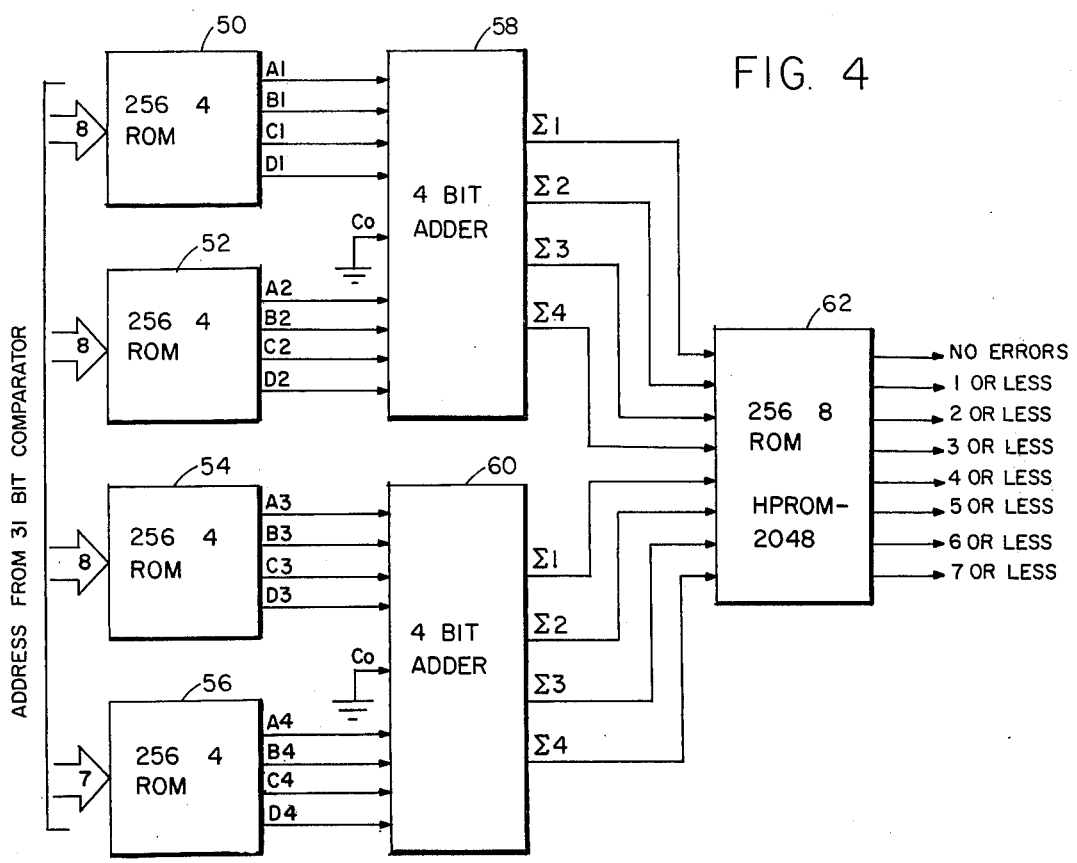
FIG. 4 shows in block diagram form a 31 bit detector.

If the channel is particularly noisy, there may be a requirement for longer words, for example, one or more 31 bit PN sequences may be required. Where it is desirable to have a 31 bit sync word detector wherein the number of tolerable error bits can be selected by monitoring one of m output lines, the embodiment of FIG. 4 meets these requirements. There are four 256 by 4 ROMs 50, 52, 54, 56 and two four bit adder circuits 58, and 60. The summed outputs from the four bit adders 58 and 60 are fed to the eight inputs of a 256 by 8 ROM 62 which will provide as shown no errors up to seven or less errors.

Figure 5:
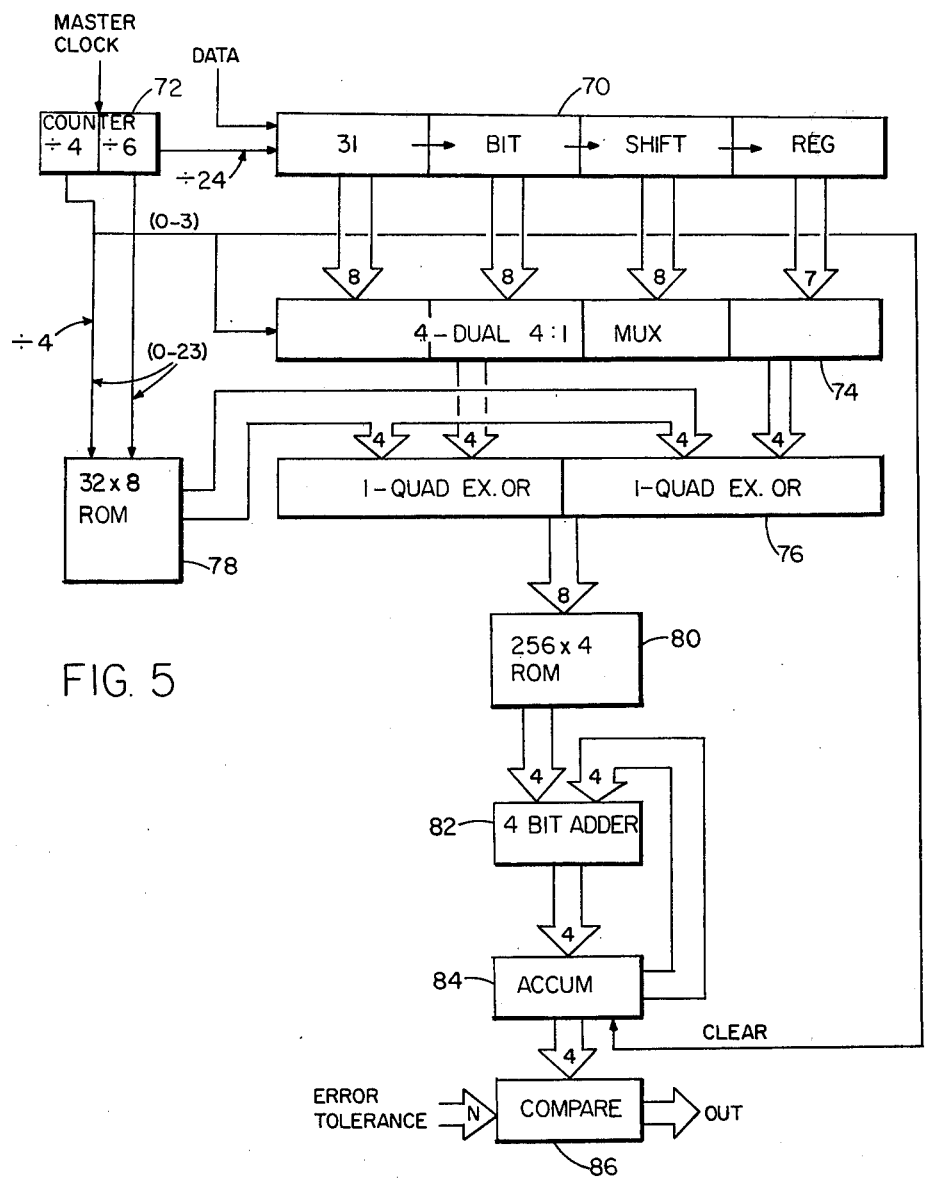
FIG. 5 shows a six code-error tolerant digital correlator.

The embodiment of FIG. 5 is a circuit which will search for and detect any of six possible 31 bit PN sequence codes with a prescribed error tolerance. The data is shifted into a 31 bit serial in-parallel-out shift register 70, one bit at a time by means of clock pulses received from a master clock (not shown). The clock pulses n should have a fequency 24 times as great as the data clock. Pulses from the master clock are fed to a counter 72 which provides two outputs (divide by 4 and divide by 24). The output of shift register 70 is fed to *four* dual 4:1 multiplexer circuits 74 which are controlled by the divide by four clock out of counter 72. The eight outputs of the multiplexers are fed to one set of exclusive OR gates 76. The other eight inputs to the exclusive OR gates 76 are supplied from the pre-programmed 32 by 8 ROM 78. The output from EX-OR gates 76 is fed to a 256 by 4 ROM. The 4 bit output from ROM 80 is added in a four bit adder 82 and fed to an accumulator 84. The four bit output from accumulator 84 is compared with the error tolerance value in comparator 86.

With counter 72 initially set at 0, the divide by four scaler of counter 72 provides an address for switching multiplexer 74 to the first group of eight lines out of shift register 70, which are applied to one set of the eight inputs of the EX-OR gates 76. With counter 72 at 0 (state 1), read only memory 78 generates the first eight bits of the first synchronous word. This word is fed to the other set of inputs of EX-OR gates 76. If there is a complete correlation, EX-OR gates 76 will generate all zeros; otherwise a one for those bits that do not correlate. The eight outputs form EX-OR gates 76 are fed to ROM 80 which converts the number of ones to an equivalent binary number. This binary number is fed to four bit adder circuit 82 which adds the output from ROM 80 with the value from accumulator 84. Originally, accumulator 84 will be cleared so the output of adder 82 will be the same as its input. The output from adder 82 is dumped into accumulator 84 where it is stored. The next master clock pulse will advance counter 72 by 1, which causes multiplexer 74 to select the second group of eight bits from shift register 70. ROM 78 now generates the second group of eight bits of the first synchronous word which are compared with the selected output of the shift register 70, and fed to ROM 80 which in turn again generates the binary equivalent of the number of errors. This number is added to the number in accumulator 84 and the sum stored back into accumulator 84. This process continues until all bits in shift register 70 have been examined. If at this time the number of errors stored in the accumulator 84 is less than the tolerable value applied to comparator 86, the output of comparator 86 will go high, indicating a PN code has been detected. An examination of the state of counter 72 at this time will indicate which code has been detected.

Accumulator 84 is now cleared before the next clock pulse is applied. The circuit is now ready to look for the next synchronous word.

The fifth clock pulse will advance the counter to state 5, i.e., the divide by four counter will be setting at binary 0 and the divide by six counter will be setting at binary 1. ROM 78 now generates the first eight bits of the second synchronous word, and multiplexer 74 selects the first eight bits of the data in shift register 70. This process continues until all six synchronous codes have been examined, i.e., after 24 master clock pulses have been generated. At this time counter 72 generates an output pulse which strobes in a new data bit, and the cycle restarts.

Obviously many modifications and variations of the present invention are possible in the light of the above teachings. It is therefore to be understood that within the scope of the appended claims the invention may be practiced otherwise than as specifically described.

What is claimed is:

1. A digital correlator comprising:
   a. shift register means for receiving input data words,
   b. digital comparator means having first inputs connected to the outputs of said shift register and second inputs for receiving an input reference word for comparing the pattern of bits of said data words with the pattern of bits of said reference word and providing 0 outputs for bits that match and ones for bits that are mismatched,
   c. first read only memory means coupled to the output of said digital comparison means for generating a coded binary number equal to the number of ones outputted from said comparison means,
   d. second read only memory means connected to the output of said first read only memory means and having a plurality of output signals representing the number of errors detected in the comparison of said data word with said reference word.

2. The correlator of claim 1 wherein said shift register means includes two eight bit shift registers, said digital comparator means includes four four bit digital comparators and said first read only memory means includes two read only memories for providing two four bit output words.

3. The digital comparator of claim 1 for use as a 31 bit sync word detector wherein the number of tolerable error bits can be selected by monitoring one of *m* output lines said digital comparator means having four eight bit digital comparators, said first read only memory means having four read only memory for providing four four bit output words, adder circuit means connected to and adding the outputs of said first read only memory means for providing a compatible input for said second read only memory means.

4. A digital correlator comprising:
   a. shift register means for receiving input data words,
   b. pre-programmed read only memory means having a plurality of reference words,
   c. sequential comparator circuit means coupled to said shift register means and to said pre-programmed read only memory means for sequentially comparing each data word with each reference word and providing a plurality of outputs of zeros and ones corresponding to bit matches and mismatches respectively, as a data word is successively compared with each reference word,
   d. a conversion read only memory means connected to the output of said comparator circuit means for converting the number of one outputs to an equivalent binary number,
   e. an accumulator having an input, first and second outputs,
   f. adder circuit means having a first input connected to the output of said conversion read only memory means, a second input connected to the second output of said accumulator for adding the output of said conversion ROM with the contents of said accumulator and having an output connected to the input of said accumulator,
   g. digital magnitude comparator circuit means connected to the first output of said accumulator and having a programmed tolerance number for producing an output signal when the number of errors is equal to or less than said tolerance number.

5. The correlator of claim 4 wherein said shift register means is a 31 bit serial in-parallel-out register.

6. The correlator of claim 5 wherein said sequential comparator circuit includes a set of exclusive OR gates and has eight outputs.

7. The correlator of claim 6 wherein the number of detected errors are added to the previous value in said accumulator until all bits of a data word are compared with all bits of one of the reference words.

8. The comparator of claim 7 and further including means for clearing said accumulator when the number stored has been compared with said programmed number.

9. The comparator of claim 8 wherein the number of reference words stored in said pre-programmed ROM is six.

* * * * *